US012749530B2

(12) United States Patent
Venturini et al.

(10) Patent No.: US 12,749,530 B2
(45) Date of Patent: Sep. 29, 2026

(54) MEMORY DEVICE TO SENSE MEMORY CELLS WITHOUT BITLINE PRECHARGE

(71) Applicant: Micron Technology, Inc., Boise, ID (US)

(72) Inventors: Michele Maria Venturini, Milan (IT); Umberto di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 18/536,098

(22) Filed: Dec. 11, 2023

(65) Prior Publication Data

US 2024/0212750 A1 Jun. 27, 2024

Related U.S. Application Data

(60) Provisional application No. 63/476,911, filed on Dec. 22, 2022.

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01)

(58) Field of Classification Search
CPC ............ G11C 13/0004; G11C 11/4094; G11C 11/4096; G11C 11/4099; G11C 13/0026; G11C 2013/0045; G11C 7/062; G11C 13/004; G11C 11/4091; G11C 2013/0054
See application file for complete search history.

(56) References Cited

U.S. PATENT DOCUMENTS 10,546,646 B2 * 1/2020 Qiang .................... G11C 16/24
2007/0263438 A1 11/2007 Chen
2010/0074015 A1 3/2010 Chandrasekhar et al.
2012/0069675 A1 * 3/2012 Sarin ...................... G11C 16/26 365/185.19
2014/0043886 A1 * 2/2014 Wu .......................... G11C 7/12 365/205
2014/0347912 A1 * 11/2014 Siau ......................... G11C 7/12 365/148
2016/0005481 A1 * 1/2016 Hung ..................... G11C 16/06 365/185.03
2018/0374518 A1 * 12/2018 Tseng ................. G11C 16/0483
2021/0012834 A1 1/2021 Hsu
2022/0013173 A1 1/2022 Tortorelli et al.
2024/0212744 A1 * 6/2024 di Vincenzo ......... G11C 13/004

OTHER PUBLICATIONS

International Search Report and Written Opinion, PCT/US2023/084912, mailed on May 3, 2024.

* cited by examiner

*Primary Examiner* — Xiaochun L Chen
(74) *Attorney, Agent, or Firm* — Greenberg Traurig

(57) ABSTRACT

Systems, methods, and apparatus related to memory devices. In one approach, a memory device controls a power supply to a detector that is used to sense a voltage of a bitline coupled to a memory cell. An output of the detector indicates a logic state of the selected memory cell. By controlling a voltage of the power supply, a detection threshold of the detector can be increased as the voltage on the bitline increases. This permits the detector to be used without requiring precharge of the bitline.

20 Claims, 9 Drawing Sheets

MEMORY DEVICE TO SENSE MEMORY CELLS WITHOUT BITLINE PRECHARGE

RELATED APPLICATIONS

The present application claims priority to Prov. U.S. Pat. App. Ser. No. 63/476,911 filed Dec. 22, 2022, the entire disclosure of which application is hereby incorporated herein by reference.

FIELD OF THE TECHNOLOGY

At least some embodiments disclosed herein relate to memory devices in general, and more particularly, but not limited to a memory device that senses a state of memory cells without needing to precharge the bitline or other access line that is used to detect whether a memory cell has reached a threshold.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic “1” or a logic “0”. In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices often store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
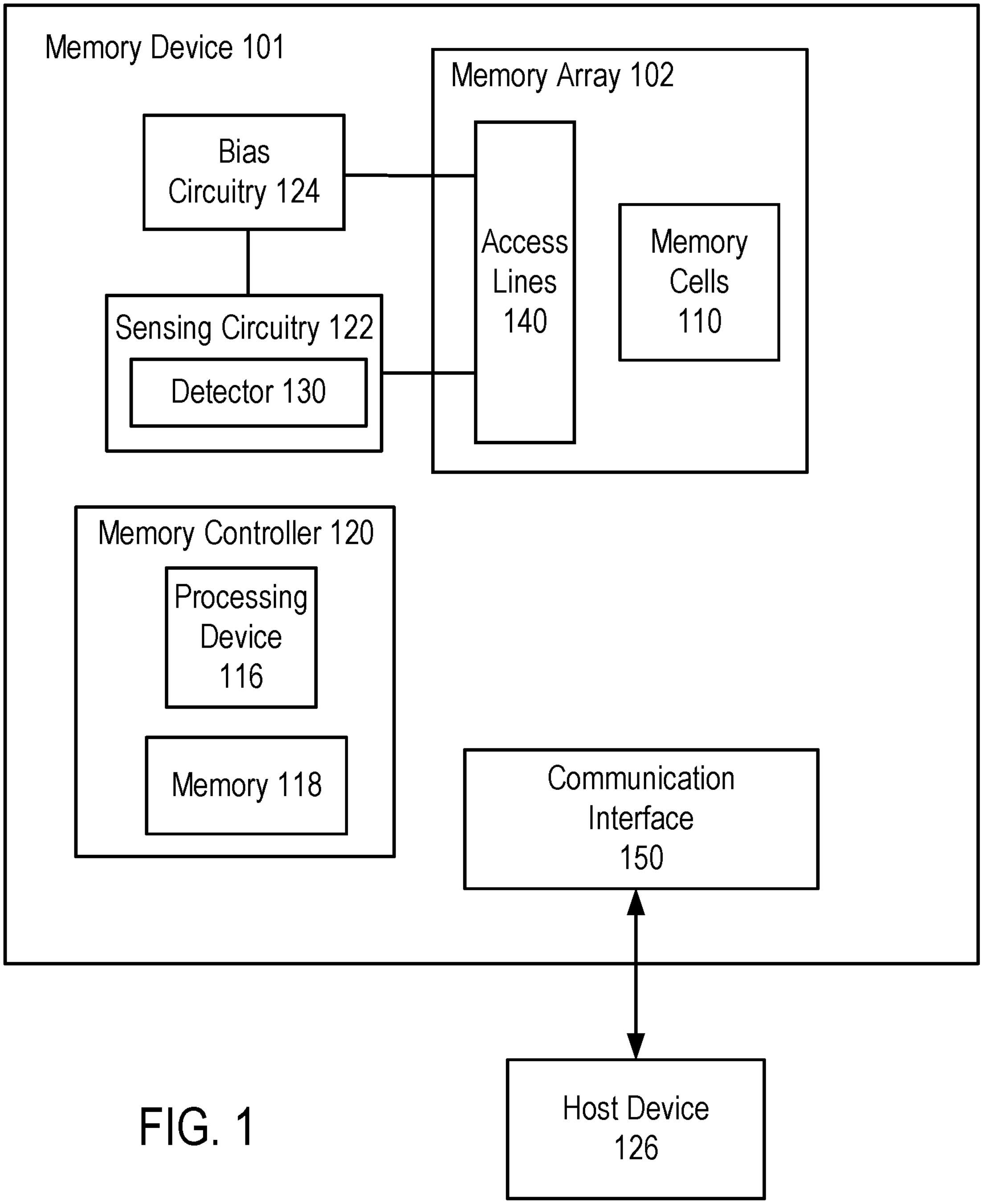
FIG. 1 shows a memory device that varies a supply of power to a detector when sensing a state of memory cells in a memory array, in accordance with some embodiments.

The following disclosure describes various embodiments for a memory device that senses memory cells in a memory array by using a detector. During this sensing, the memory device controls a power supply to the detector using a ramp voltage. The memory device may, for example, store data used by a host device (e.g., a computing device of an autonomous vehicle, or another computing device that accesses data stored in the memory device). In one example, the memory device is a solid-state drive mounted in an electric vehicle.

In some existing memory devices, there is a need to read memory cells using a high-performance sense in order to promptly detect switching of the cells. This is desirably done while keeping a low read-out time, and reducing the current drawn. In one example, the memory cells are phase change memory cells (e.g., chalcogenide cells) which exhibit a snapback behavior when switching.

There are several different types of detectors that may be used to sense a state of a cell by sensing a voltage on a bitline. For example, the detector may use a cascoded-based architecture, a sense amplifier-based architecture, or an inverter-based architecture. One limitation that such architectures share is that they require the precharge of the bitline (or digit line) used to sense the cell. This precharge can require up to 30-40 ns, which significantly reduces read access time. For example, a sense amplifier cannot be activated to start the sensing of a memory cell until this precharge is complete. Further, this precharge is a significant portion of power consumption for the memory device.

To address the above and other technical problems, a memory device controls a power supply to a detector used to sense a bitline coupled to a memory cell. For example, by controlling a voltage of the power supply, a detection threshold of the detector increases as a voltage on the bitline is increased. This permits the detector to be used without requiring precharge of the bitline.

In one embodiment, a sensing architecture uses an IV characteristic of chalcogenide or other memory cells that exhibit a snapback behavior to advantage during sensing of the cells. The leakage current of such memory cells is a monotonic function of the voltage applied across the cell. As the voltage applied to the cell increases, the leakage current through the cell only gradually increases. However, when a threshold voltage of the cell is reached, the current through the cell increases sharply and significantly. The cell current is not a function of its voltage due to the snapback.

The sensing architecture applies a voltage to a bitline for a selected memory cell. The voltage is applied by a cascode transistor having its gate coupled to a ramp voltage (e.g., a voltage that increases with a constant slope). A reference current is provided through the cascode transistor to the bitline from a current source (e.g., current generator) coupled to the cascode transistor. The reference current is provided to the bitline in a precise manner.

If the ramp slope of the gate voltage is equal or higher than an RC time constant of the bitline, the voltage on the memory cell ramps up in a manner that follows the ramp voltage, but without a snapback as long as the voltage applied across the cell is below its threshold voltage. This permits the sensing of the memory cell to be started without needing to wait for a precharge of the bitline.

When the memory cell exhibits snapback, the current through the cell exceeds the reference current, which permits detection of the cell switching. In one example, the detector is an inverter having an input coupled to the bitline. When the cell switches, the bitline is pulled to a lower voltage, causing the inverter to switch.

In one embodiment, a memory device includes a memory array having chalcogenide memory cells in a three-dimensional cross-point architecture. A wordline and bitline are each biased to access at least one memory cell in the array.

A current source (e.g., a current generator) provides a reference current for a sensing operation to read the memory cell. A first transistor (e.g., M1) couples the current source to the bitline. A gate voltage of the first transistor is increased in magnitude during sensing of the memory cell. In one example, the gate voltage is a ramp voltage with a constant slope. Initially, the bitline voltage increases as the ramp voltage increases.

A detector (e.g., an inverter 308) has an input coupled to the bitline. The detector detects whether the memory cell has reached a threshold (e.g., cell has snapped). When the cell snaps (exhibits snapback), then the bitline voltage falls below a detection threshold of the detector.

A second transistor (e.g., M2) provides a supply voltage (e.g., insup) to the detector. A gate voltage of the second transistor is increased in magnitude during the sensing of the first memory cell. In one example, the gate voltage is a ramp voltage (e.g., $V_{ramp}$) with a constant slope. The gate voltage of the second transistor can be the same ramp voltage as applied to the gate of the first transistor, or can be a different ramp voltage. The detection threshold of the detector increases as the gate voltage of the second transistor increases.

Various advantages are provided by the sensing architecture embodiments described herein. In one advantage, a sensing architecture is provided with reduced read-out time due to avoiding the need for a precharge phase as used in existing detectors. Also, the provided sensing architecture is more area efficient, and power efficient (e.g., due to no or lower DC consumption). Further, the sensing architecture can be implemented for either faster or slower read operations (e.g., read operations of 10 nanoseconds to one microsecond).

In addition, for some cases the sensing architecture can reduce leakage problems. For example, the biasing of each memory cell when being sensed is adaptive to the switching behavior of the particular cell. This avoids over-biasing the memory cell with a high fixed voltage as used in existing approaches. This generally reduces leakage current through the memory cells. For example, the leakage current is lower for those cells that have a lower threshold voltage due to this adaptive biasing.

FIG. 1 shows a memory device 101 that varies a supply of power to a detector 130 when sensing a state of memory cells 110 in a memory array 102, in accordance with some embodiments. In one example, memory cells 110 are chalcogenide memory cells.

Sensing circuitry 122 senses a state of memory cells 110. Sensing circuitry 122 includes detector 130. In one example, detector 130 is an inverter. Memory cells 110 are selected using access lines 140. In one example, access lines 140 include wordlines and bitlines in a cross-point memory array. Bias circuitry 124 biases selected ones of access lines 140 for selecting a portion of memory cells 110 to be sensed. Bias circuitry 124 also supplies power to sensing circuitry 122, including supplying power to detector 130.

Memory controller 120 controls various operations of memory device 101, including read and write operations on memory cells 110. Memory controller 120 includes processing device 116 and memory 118. Some operations are controlled by controller 120 in response to various commands received from host device 126 on communication interface 150.

In one embodiment, communication interface 150 receives a read command from host device 126. In response to receiving the read command, controller 120 initiates a read operation. As part of the read operation, a memory cell 110 is selected to have its logic state determined by sensing circuitry 122.

Bias circuitry 124 drives voltages on access lines 140 to select the memory cell, including driving a voltage on a bitline used to select the memory cell. To sense the state of the memory cell, detector 130 monitors a voltage on the bitline. During the read operation, bias circuitry 124 applies a reference current to the bitline. The current is controlled using a voltage that is ramped (sometimes referred to herein as a ramp voltage).

During the read operation, the voltage on the bitline increases as the ramp voltage is increased. When the memory cell reaches a threshold voltage, a current through the memory cell exceeds the reference current, which causes the voltage on the bitline to rapidly decrease. Detector 130 detects this change of voltage. An output of detector 130 is used by sensing circuitry 122 to determine the logic state (e.g., 1 or 0) of the memory cell that has been read.

During the read operation, bias circuitry 124 increases the supply of power to detector 130. This causes a detection threshold of detector 130 to increase (see, e.g., $V_{th}$ inv of FIG. 4). In one embodiment, the supply of power to detector 130 is controlled using a voltage that is ramped. In one example, this ramp voltage is the same as the ramp voltage used to control the reference current above. In one example, the ramp voltages are different in magnitude, but are controlled to have equal rates of change (slopes).

In one embodiment, memory cells 110 store user data for host device 126. Memory cells 110 store data in either a first logic state or a second logic state. In one example, bias circuitry 124 includes wordline and bitline drivers (not shown) to bias wordlines and bitlines of memory array 102.

Sensing circuitry 122 may include sense amplifiers for sensing a characteristic associated with memory cells of the memory array 102. The characteristic can be, for example, a voltage and/or current associated with a selected memory cell. A detection threshold of the sense amplifiers can be varied during a read operation generally as described herein.

In one embodiment, controller 120 causes bias circuitry 124 to apply voltages to selected memory cells 110. In one example, the voltages are increasing magnitudes of voltage values (e.g., +2, +2.5, +3, +3.5, +4, +4.5, +5 V) separated by steps (e.g., 0.5 V steps).

In one embodiment, memory controller 120 includes one or more processing devices 116 and memory 118. In one example, memory 118 stores firmware executed by processing device 116 to select and apply the read voltages. Memory controller 120 can use bias circuitry 124 to generate voltages for applying read and other voltages (e.g., initial read and read retry). Bias circuitry 124 can also generate voltages for applying write voltages to memory cells 110 as part of programming operations.

In one embodiment, if sensing circuitry 122 determines that the current for a memory cell is greater than a fixed threshold (e.g., a predetermined level of current), then memory controller 120 determines that the memory cell has switched (e.g., snapped).

In one embodiment, memory controller 120 receives a write command from host device 126. The write command is accompanied by data (e.g., user data of a user of host device 126) to be written to memory array 102. In response to receiving the write command, controller 120 initiates a programming operation.

In one example, the polarity of the read or write pulses may be either a first polarity or a second polarity. For example, a write pulse may apply a voltage to a memory cell in a first polarity (e.g., bitline at 6V and wordline at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component.

By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). A current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

At least some embodiments herein relate to memory devices that use bipolar operations for a memory array (e.g., for multi-level memory cells). In one example, bipolar select voltages are used to select memory cells of the memory array. In one example, the memory cells are arranged in a cross-point architecture. In one example, each memory cell is formed using a single select device. In one example, the select device includes a chalcogenide material that switches (e.g., snaps) when a sufficient voltage is applied across the memory cell.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

In one example, the threshold voltage of a memory cell is such that when the voltage applied across the memory cell is increased to above the threshold voltage, the memory cell switches by changing rapidly or abruptly, snapping (e.g., for a chalcogenide memory cell), or jumping from a non-conductive state to a conductive state. The non-conductive state allows a small leak current to go through the memory cell; and in contrast, the conductive state allows more than a threshold amount of current to go through. Thus, a memory device can use a detector (e.g., a sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item.

To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

Figure 2:
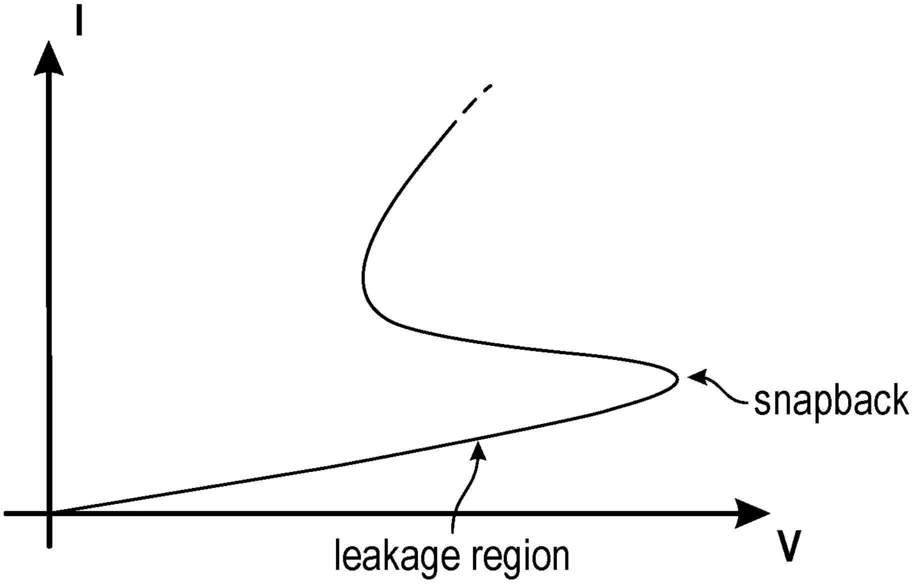
FIG. 2 shows an exemplary current-voltage (IV) curve for a memory cell, in accordance with some embodiments.

FIG. 2 shows an exemplary current-voltage (IV) curve for a memory cell, in accordance with some embodiments. As illustrated, a current I through the memory cell monotonically increases (in a leakage region) as a voltage V applied across the memory cell increases.

The current increases with increasing voltage until the threshold voltage of the memory cell is reached. At this point, the memory cell exhibits a snapback behavior as illustrated in which the current through the memory cell rapidly increases. For example, as discussed above, this current through the memory cell after snapback pulls down a voltage on a selected bitline so that detector 130 detects that the memory cell has reached a threshold and snapped.

As one example, the illustrated IV curve is for a chalcogenide memory cell. Other types of phase change memory cells exhibit a similar snapback behavior. In one example, the illustrated IV curve is for one of memory cells 110.

Figure 3:
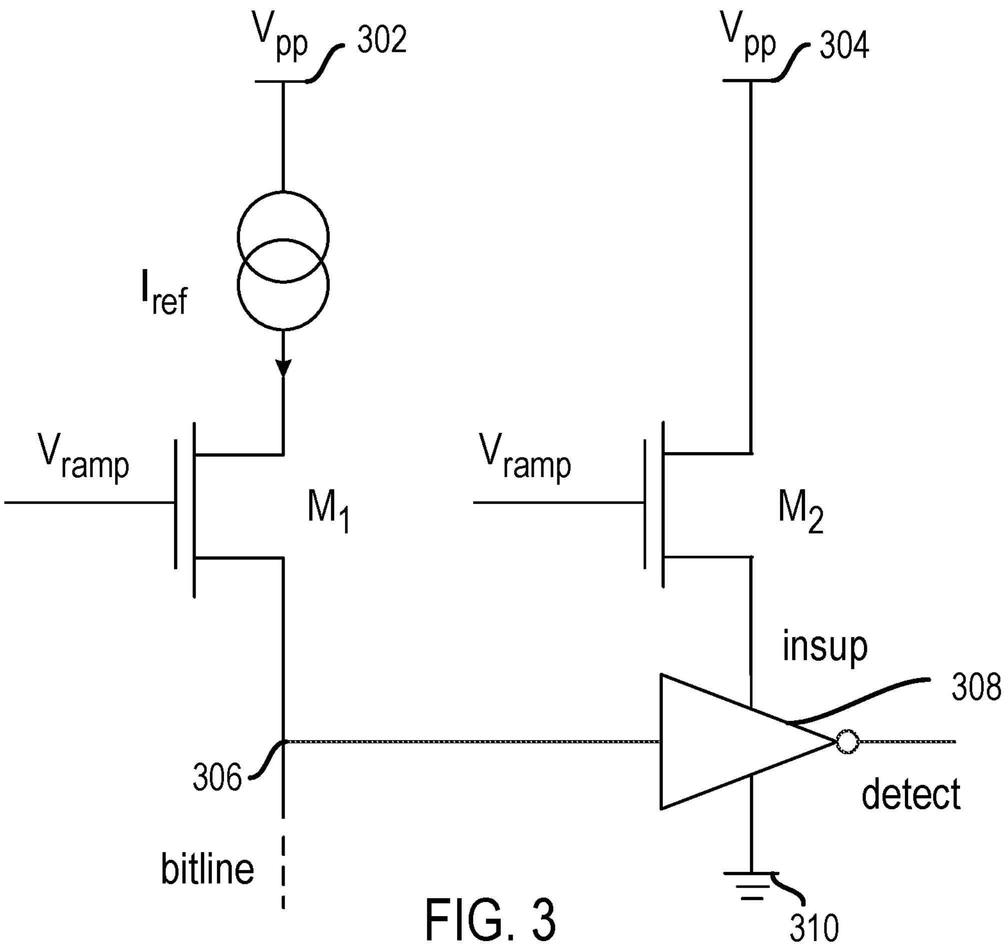
FIG. 3 shows a circuit for sensing a memory cell using a detector for which a supply voltage to the detector is controlled using a ramp voltage, in accordance with some embodiments.

FIG. 3 shows a circuit for sensing a memory cell using a detector for which a supply voltage to the detector is controlled using a ramp voltage, in accordance with some embodiments. The detector includes inverter 308. An input to inverter 308 is coupled to a bitline at node 306. A memory cell to be read is coupled to the bitline. An output of inverter 308 provides a signal detect, which corresponds to the logic state of the memory cell coupled to the bitline.

The supply voltage insup is provided to inverter 308 by transistor M2. Transistor M2 is coupled to a positive supply voltage 304 (e.g., Vpp). A gate voltage Vramp is applied to a gate of transistor M2 to control the power supply to inverter 308. Inverter 308 is also connected to a negative supply voltage 310 (e.g., ground).

Transistor M1 couples a positive supply voltage 302 (e.g., Vpp) to node 306. Current source Iref (e.g., a current generator) provides a reference current to node 306. A gate voltage Vramp is applied to a gate of transistor M1 to control the supply of current from current source Iref to node 306.

In one example, each transistor M1 and M2 is an n-channel MOSFET. In one example, the gate voltages for transistors M1 and M2 are increased as a ramp voltage Vramp during the read operation.

In one example, during the initial portion of a read operation (e.g., as discussed above for FIG. 1), the memory cell selected by the bitline is non-conducting. Thus, the current provided by current source Iref increases the voltage at node 306. This voltage is above a threshold voltage of inverter 308. Thus, the output signal detect remains at a low voltage (e.g., logic 0).

Later during the read operation, if the selected memory cell coupled to the bitline snaps, then the voltage of node 306 is pulled low. This causes the output signal detect to switch to a high voltage (e.g., logic 1).

Figure 4:
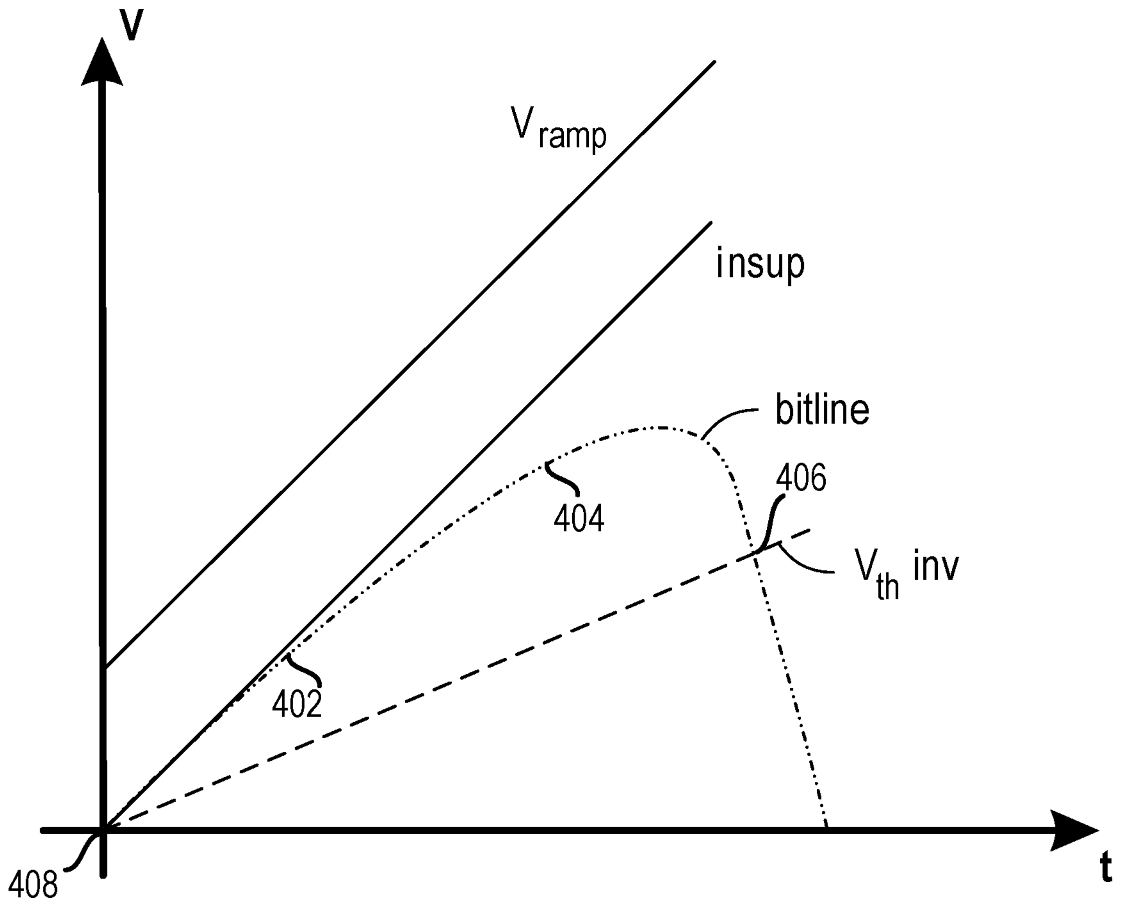
FIG. 4 shows exemplary voltage waveforms for the circuit of FIG. 3.

FIG. 4 shows exemplary voltage waveforms for the circuit of FIG. 3. A sensing operation starts at initial time 408 (e.g., under control of controller 120). Ramp voltage Vramp increases at a steady rate (constant slope) from time 408. The ramp voltage is applied to the gates of both transistors M1 and M2.

As time increases, the supply voltage insup provided to inverter 308 increases, as illustrated. Also, the voltage on the bitline increases, as illustrated, due to current source Iref driving the voltage higher (and being able to overcome leakage current of the selected memory cell and/or other non-selected cells on the bitline). Initially, the bitline voltage and supply voltage insup are almost identical in a portion 402 of the bitline waveform.

Later in time, at portion 404 of the bitline waveform, the leakage current through the selective memory cell increases. This results in the slope of the bitline waveform decreasing (prior to snapping).

As time increases, the threshold voltage of inverter 308 also increases, as illustrated. The bitline voltage remains above the inverter threshold voltage until the memory cell snaps, at which time the bitline voltage falls below the inverter threshold voltage at point 406. At point 406, inverter 308 switches so that the signal detect output from inverter 308 changes state (e.g., from low to high). In one example, the threshold voltage of inverter 308 is about halfway between positive and negative supply voltages 304, 310. In one example, switching point 406 is reached between 10 to 500 nanoseconds after sensing is started at time 408.

It is noted that the threshold voltage of inverter 308 adapts with the biasing voltage applied across the selected memory cell. This is an advantage because the threshold voltages of memory cells in the memory array can vary dramatically from one to another (e.g., some fairly high, and some fairly low). Thus, memory cells having a lower threshold voltage will be subject to less stress, which increases the endurance of those memory cells. In contrast, existing systems require that the threshold voltage of the inverter be set to a high, constant value. This results in applying higher voltages than necessary to those memory cells that have lower threshold voltages.

In one example, with the increasing of the voltage on the bitline, the leakage through the memory cell increases, thus decreasing the slope of the bitline. This occurs before the memory cell snaps. The power supply to inverter 308 is controlled with the same voltage Vramp used to control transistor M1, so that inverter 308 remains turned off. This reduces power consumption of the memory device. Later in the sensing operation when the memory cell snaps, the bitline goes low and inverter 308 switches. In one example, the threshold voltage of inverter is within plus or minus 20% of the voltage Vramp/2.

In one example, the same ramp voltage Vramp is applied to the gates of transistors M1 and M2. Voltage insup=Vramp−Vth2 (threshold voltage of transistor M2). Voltage insup is approximately equal to the voltage of the selected bitline. The bitline voltage is equal to Vramp−Vth1 (threshold voltage of transistor M1). Thus, inverter 308 is off at the start of the sensing operation at time 408.

Later in the sensing operation, the voltage of the bitline falls below voltage insup−|Vthp|=Vramp−Vth1−|Vthp|. |Vthp| is the magnitude of the threshold voltage for the internal p-type transistor (e.g., p-type MOSFET; not shown) of inverter 308. Thus, inverter 308 turns on.

Figure 5:
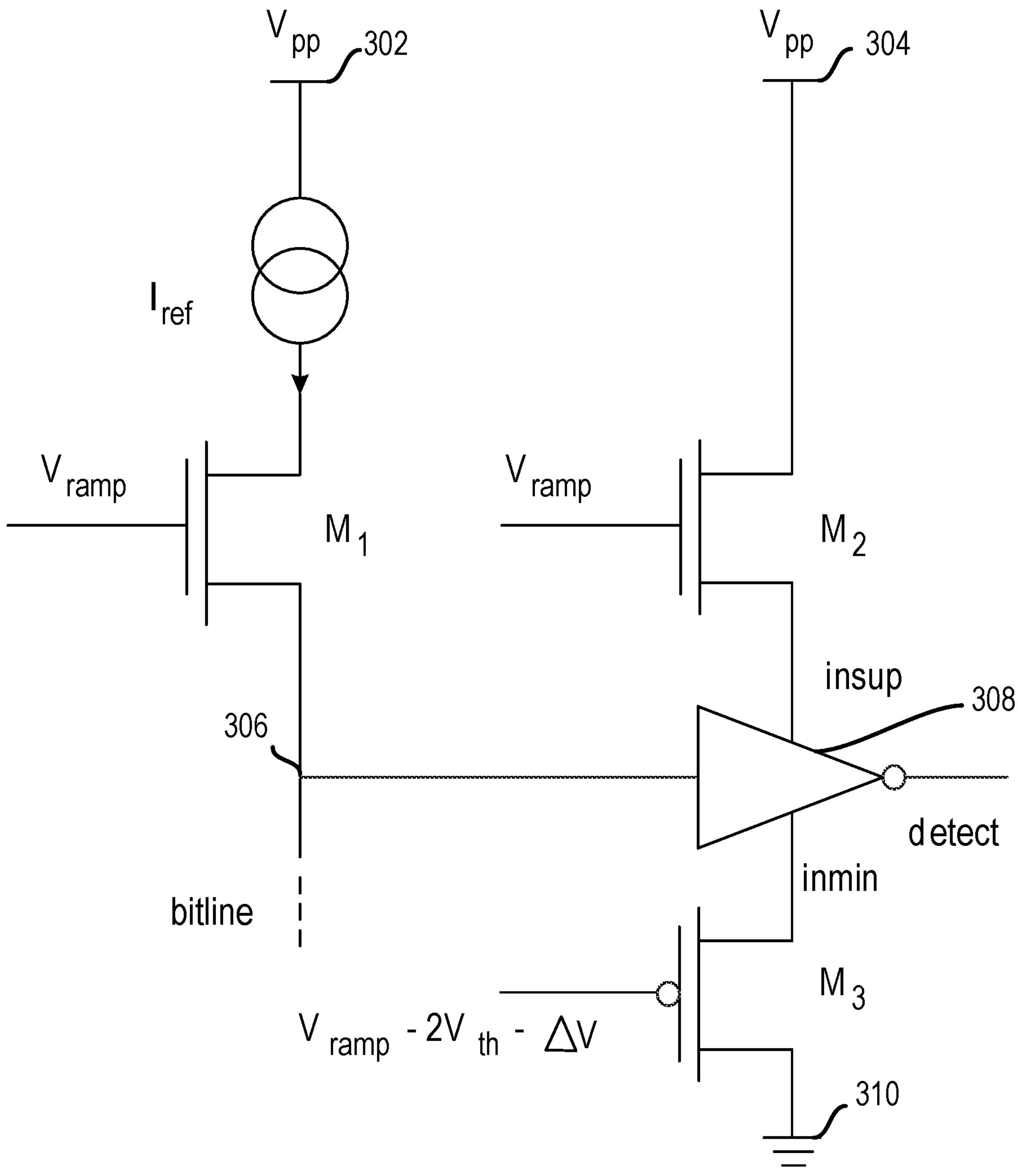
FIG. 5 shows a circuit for sensing a memory cell in a positive polarity using a detector for which positive and negative supply voltages to the detector are controlled using a ramp voltage, in accordance with some embodiments.

FIG. 5 shows a circuit for sensing a memory cell in a positive polarity using a detector for which positive and negative supply voltages to the detector are controlled using a ramp voltage, in accordance with some embodiments. The circuit of FIG. 5 is similar to the circuit of FIG. 3 above except that a transistor M3 is added to couple negative supply voltage 310 (e.g., ground) to a negative supply voltage inmin provided to inverter 308. In one example, transistor M3 is a p-type MOSFET. In one example, negative supply voltage inmin is coupled to an internal n-type MOSFET (not shown) of inverter 308.

Transistor M3 controls the negative supply voltage inmin provided to inverter 308. A voltage is applied to a gate of transistor M3 using a ramp voltage. In one embodiment, the slope of the voltage applied to the gate of transistor M3 is the same as the slope of the ramp voltage is applied to transistors M1 and M2.

In one example, the gate voltage applied to transistor M3 has a magnitude given by Vramp−$2V_{th}$−ΔV. Vramp is a magnitude of the ramp voltage applied to transistors M1 and M2. $2V_{th}$ is the sum of the threshold voltages for transistors M2 and M3, which is expressed as $2V_{th}$=|Vt(M2)|+|Vt(M3)|.

ΔV is an arbitrary voltage selected as desired for particular design. For example, ΔV can be selected to configure a difference between voltage insup and voltage inmin, or between the voltage of the bitline and voltage inmin (see, e.g., FIG. 6).

In one embodiment, the threshold voltage of inverter 308 increases at the same rate as voltages insup and inmin. The voltages insup and inmin increase at the same rate as voltage Vramp applied to the gates of transistors M1 and M2. Thus, the threshold voltage of inverter 308 increases at the same rate as voltage Vramp.

By limiting the negative or lower supply range of the internal NMOS device (not shown) in inverter 308, performance can be improved. In the previous architecture of FIG. 3, the switching or threshold voltage of inverter 308 was defined only by the positive or top power supply of inverter 308 (as the lower supply is fixed to ground). Configuring the lower supply permits having an inverter threshold closer to a point of snapping by the memory cell to reduce power consumption and/or current flowing through the selected memory cell.

The addition of PMOS transistor M3 controls the negative supply voltage to increase the actual lower supply voltage provided to inverter 308. Thus, the switching threshold of the inverter 308 is brought closer to the snapback voltage of the selected memory cell.

Figure 6:
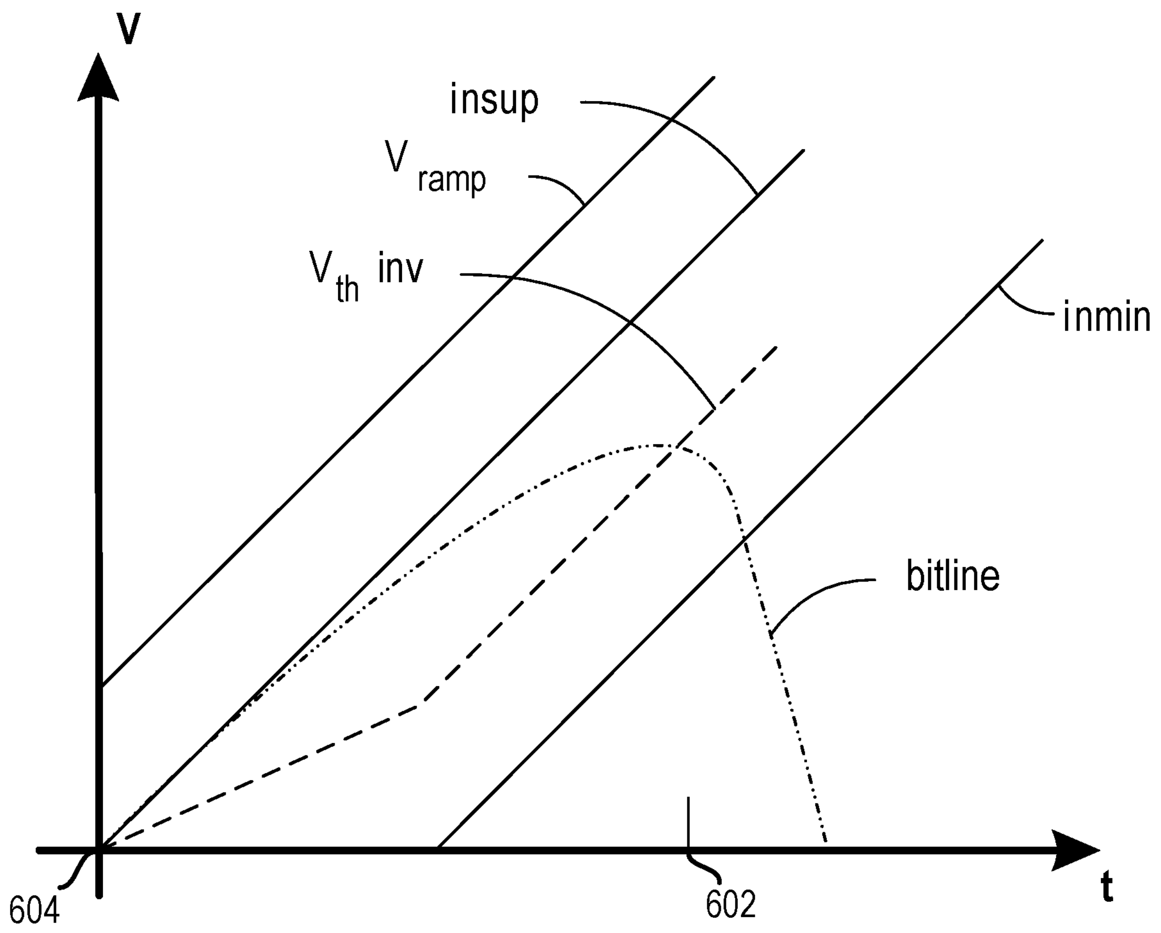
FIG. 6 shows exemplary voltage waveforms for the circuit of FIG. 5.

FIG. 6 shows exemplary voltage waveforms for the circuit of FIG. 5. A sensing operation starts at time 604. Ramp voltage Vramp is applied to the gates of transistors M1 and M2. Upper and lower supply voltages insup and inmin are provided to inverter 308, and these upper and lower supply voltages increase at the same rate as Vramp. Thus, the threshold voltage $V_{th}$ inv of inverter 308 increases at the same rate as ramp voltage Vramp (other than for an initial portion of the waveform), as illustrated.

The voltage of the bitline increases initially almost identically to voltage insup. As leakage through the selected memory cell increases, the rate of voltage increase for the bitline slows. Eventually, at time 602 the memory cell snaps, and the bitline voltage at node 306 falls below the threshold voltage of inverter 308, as illustrated.

In one embodiment, the ramping of voltage inmin reduces the extent of the area (e.g., voltage insup−voltage inmin) for conduction of inverter 308. This reduces power consumption. For the gate voltage applied to transistor M3, ΔV can be arbitrarily selected to adjust the shape of the waveforms (e.g., vertical voltage distance) for voltages insup and inmin. This defines the width of the window between insup and inmin.

In one embodiment, the difference between voltage insup and the inverter threshold is the same for all memory cells being read. Thus, every memory cell has to produce the same voltage drop on the bitline. Note this is independent of the biasing point of the particular memory cell. So, the switching of the inverter happens with the same delay for each cell read because when a cell switches, it produces the same current absorption (charge removal from the bitline). So, the response of the inverter is the same regardless of the biasing point of the cell.

Figure 7:
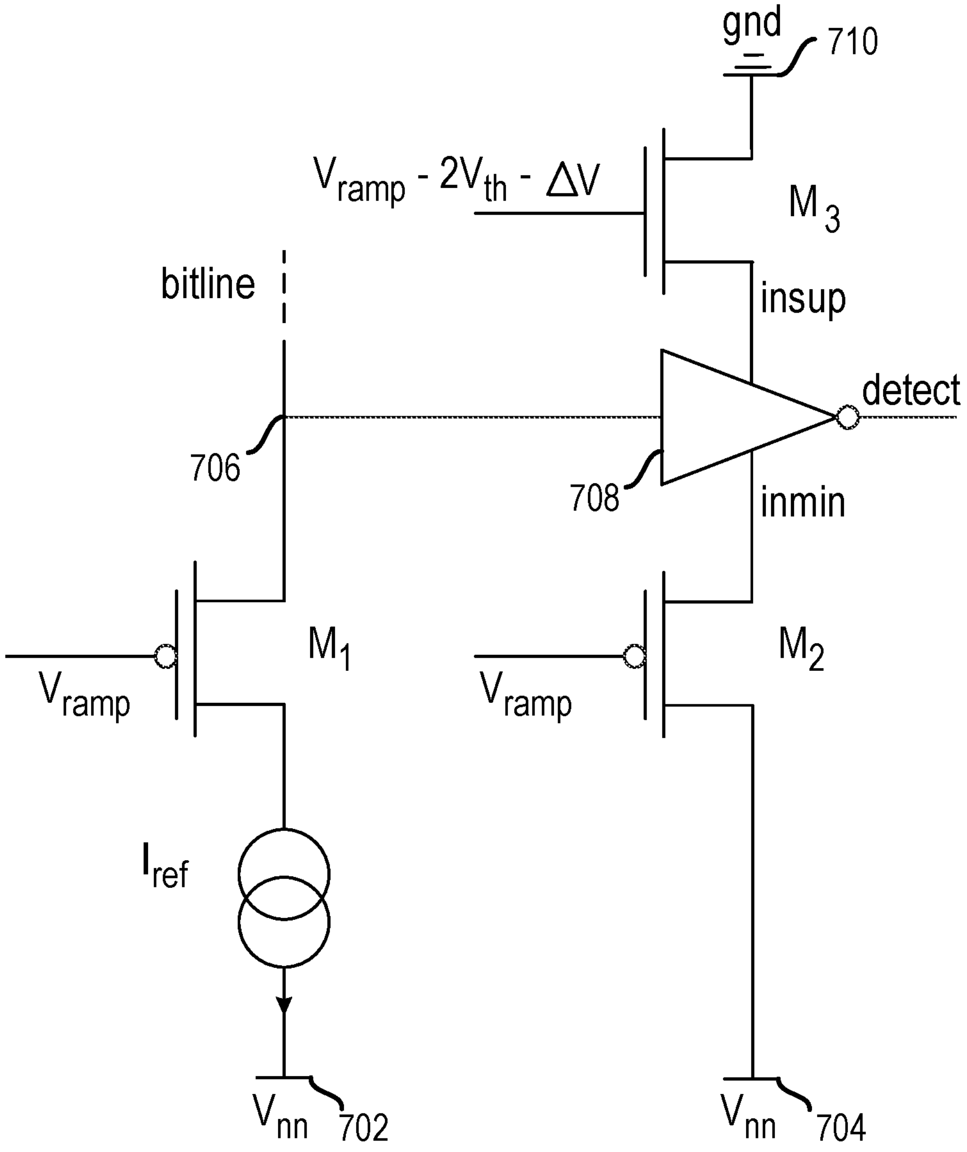
FIG. 7 shows a circuit for sensing a memory cell in a negative polarity using a detector for which positive and negative supply voltages to the detector are controlled using a ramp voltage, in accordance with some embodiments.

FIG. 7 shows a circuit for sensing a memory cell in a negative polarity using a detector for which positive and negative supply voltages to the detector are controlled using a ramp voltage, in accordance with some embodiments. The circuit of FIG. 7 is similar to the positive polarity circuit of FIG. 5 above, except that the polarity of its operation is changed to the opposite negative polarity.

In one embodiment, read operations are performed on multi-level cells (more than one bit of data is stored in each cell). In some cases, there is a need to read such memory cells in both positive and negative polarity. For example, during a read operation, the cell could snap in the positive polarity, snap in the negative polarity, or not snap at all. The controller can select the particular sensing circuitry that is suitable for the desired polarity during the read operation.

Node 706 is coupled to a bitline used to select a memory cell to be sensed by inverter 708. Transistor M1 couples negative voltage supply 702 (e.g., Vnn) to node 706. Transistor M2 couples to negative voltage supply 704 (e.g., Vnn) to provide a negative or lower power supply voltage to inverter 708.

Transistor M3 couples to a positive or upper supply 710 (e.g., ground) to provide a positive or upper power supply voltage to inverter 708, similarly as discussed above except in an opposite polarity.

In one embodiment, transistors M1 and M2 are not able to have their bulk voltage biased to a negative supply voltage (e.g., Vss or Vnn). Instead, a higher voltage (e.g., Vpp) is used to bias the bulk. The use of a highly positive voltage with the transistors M1 and M2 operating in a negative range causes a significant body effect, which will increase the threshold of the transistor. However, there is a compensation between voltage inmin and the bitline voltage because the two PMOS transistors M1 and M2 see the same body effect. This is because both transistors will be affected by the same threshold voltage variation without affecting the inverter operation.

Figure 8:
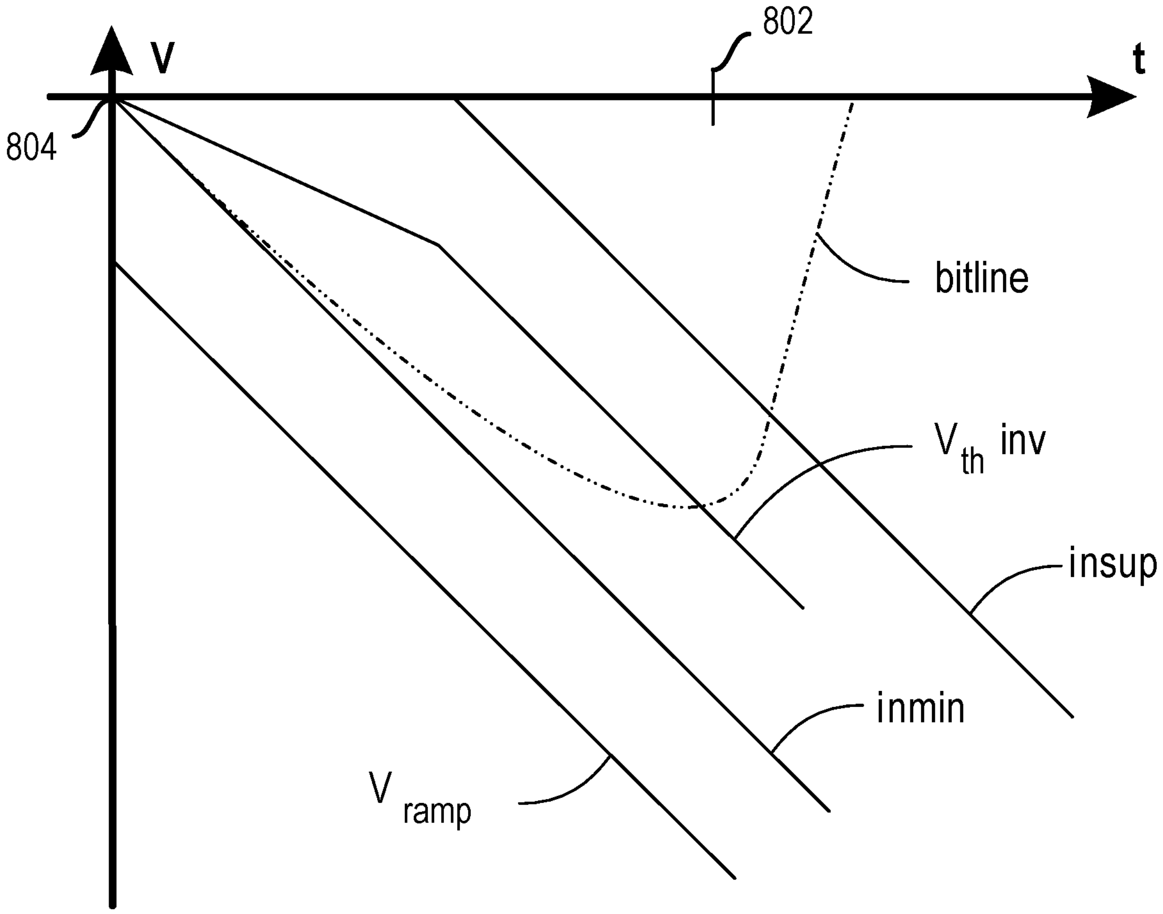
FIG. 8 shows exemplary voltage waveforms for the circuit of FIG. 7.

FIG. 8 shows exemplary voltage waveforms for the circuit of FIG. 7. A sensing operation starts at time 804. Ramp voltage Vramp decreases at a constant rate. Voltages inmin and insup decrease at the same rate as ramp voltage Vramp.

Threshold voltage $V_{th}$ inv of inverter 708 decreases at the same rate as ramp voltage Vramp (other than for an initial portion of the waveform), as illustrated. The bitline voltage remains below the threshold voltage of inverter 708 until the selected memory cell snaps at time 802. Due to the memory cell snapping, the bitline voltage increases and reaches the threshold voltage of inverter 708. This causes inverter 708 to switch and provide output signal detect, which indicates that the selected memory cell has switched.

Figure 9:
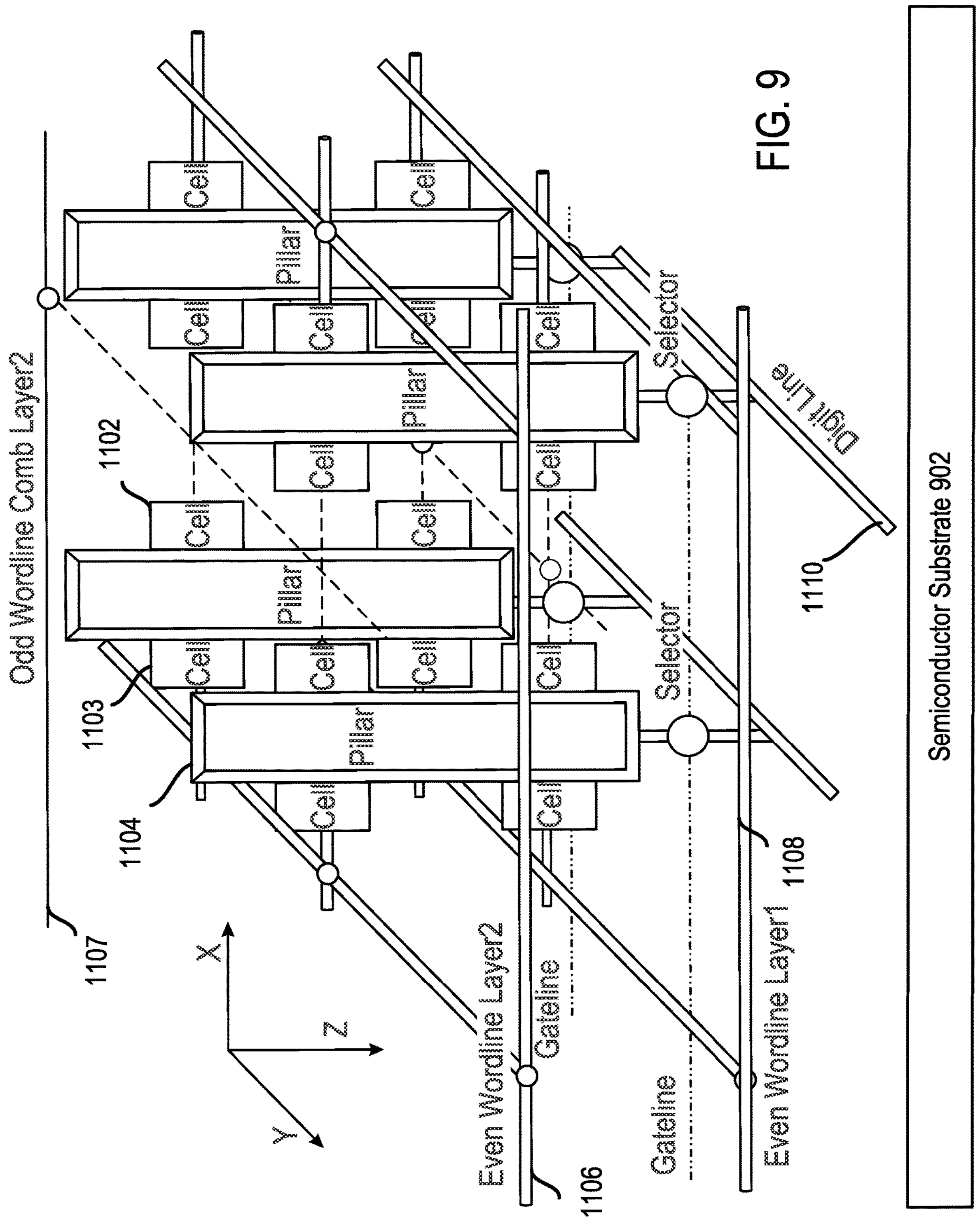
FIG. 9 shows an exemplary three-dimensional memory array structure including memory cells that are sensed by a detector, in accordance with some embodiments.

FIG. 9 shows an exemplary three-dimensional memory array structure including memory cells that are sensed by a detector, in accordance with some embodiments. In one example, the memory cells are memory cells 110 that are sensed by detector 130 of FIG. 1.

The memory array and memory cells described herein are not limited to use in a planar architecture (e.g., with cells at crossing of wordlines (WLs) and bitlines (BLs) on different levels). Instead, the approach also can be used for vertical architectures (e.g., vertical BL pillars crossing horizontal WL planes).

An example of a vertical architecture that can be used with embodiments described in this disclosure is illustrated in FIG. 9. As illustrated, a memory array includes memory cells 1102, 1103. The memory array is formed above semiconductor substrate 902. In one example, semiconductor substrate 902 includes logic circuitry. In one example, the logic circuitry provides at least a portion of bias circuitry 124 and/or sensing circuitry 122.

Each memory cell 1102, 1103 can be selected using a wordline (e.g., 1106, 1107, or 1108) and a digit line (e.g., 1110). Each digit line is coupled to a bitline pillar (e.g., 1104) by a select transistor (selector). Memory cells 1102, 1103 are an example of memory cells 110 of FIG. 1.

In one embodiment, each wordline extends in one of a plurality of horizontal planes of wordlines 1106, 1107, 1108 stacked vertically above semiconductor substrate 902. Each digit line (e.g., 1110) is coupled to a bitline pillar 1104. Each bitline pillar 1104 extends vertically away from semiconductor substrate 902. Each memory cell 1102, 1103 is located on sides of one of bitline pillars 1104.

In one embodiment, the memory array has a vertical array architecture comprising vertical bitlines (e.g., vertical pillars 1104) intersecting a plurality of horizontal decks of wordlines (e.g., even wordlines 1106 and odd wordlines 1107). Each deck is configured as two interdigitated wordline combs so that each bitline forms two cells 1102, 1103 at each of the decks. In one example, even wordlines 1106 are interdigitated with odd wordlines 1107 in a comb structure, as illustrated.

Figure 10:
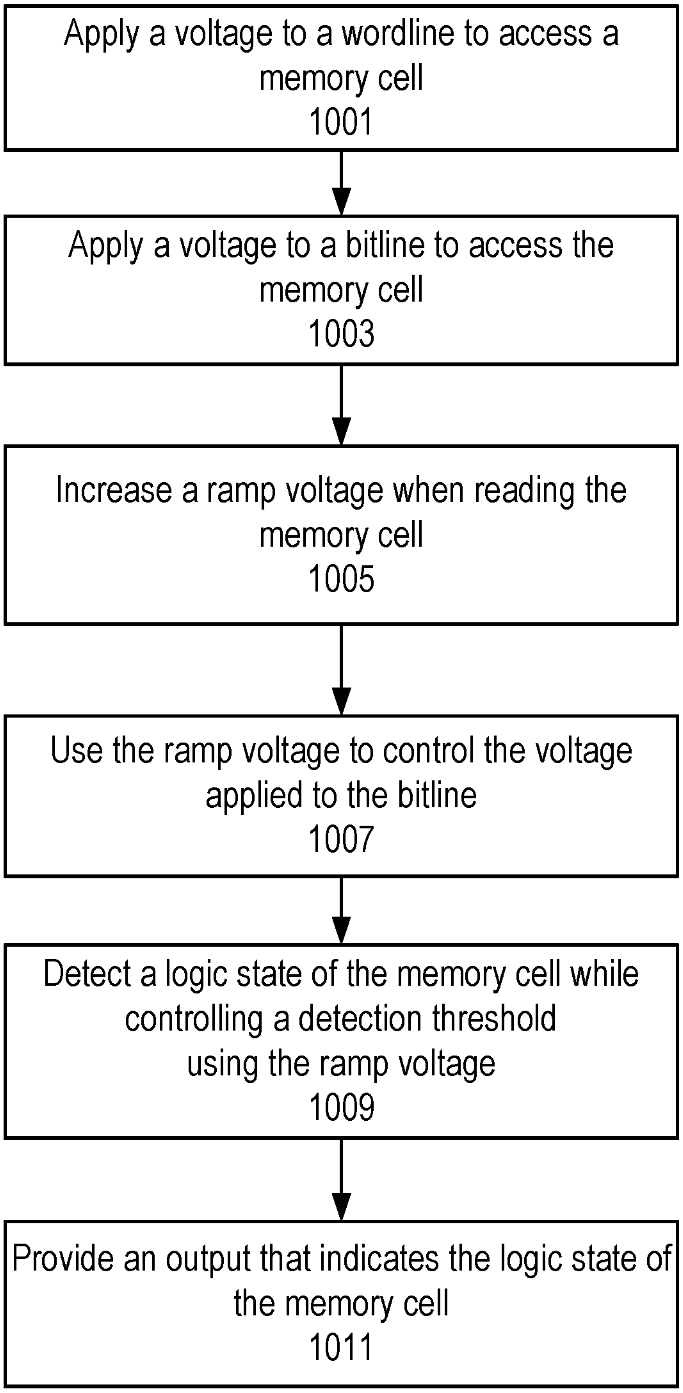
FIG. 10 shows a method for controlling a detection threshold when sensing a memory cell, in accordance with some embodiments.

FIG. 10 shows a method for controlling a detection threshold when sensing a memory cell, in accordance with some embodiments. For example, the method of FIG. 10 can be implemented in the system of FIG. 1. In one example, the detection threshold is the threshold voltage of inverter 308 or 708.

The method of FIG. 10 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 10 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1001, a voltage is applied to a wordline to access a memory cell. In one example, the voltage is driven by bias circuitry 124 on a selected wordline of access lines 140.

At block 1003, a voltage is applied to a bitline to access the memory cell. In one example, the voltage is driven by bias circuitry 124 on a selected bitline of access lines 140.

At block 1005, a ramp voltage is increased when reading the memory cell. In one example, the ramp voltage is gate voltage Vramp applied to transistors M1 and M2 of FIG. 3.

At block 1007, the ramp voltage is used to control the voltage applied to the bitline. In one example, the gate voltage Vramp applied to transistor M1 controls the voltage applied to node 306.

At block 1009, a logic state of the memory cell is detected while controlling a detection threshold using the ramp voltage. In one example, a logic state of the memory cell selected by the bitline of FIG. 3 is detected by inverter 308. The threshold voltage of inverter 308 is controlled by the gate voltage Vramp applied to transistor M2.

At block 1011, an output is provided that indicates the logic state of the memory cell. In one example, inverter 308 provides output signal detect to indicate the logic state of the memory cell coupled to node 306.

In one embodiment, an apparatus comprises: a memory array (e.g., 102) having memory cells; a bitline (e.g., the bitline of FIG. 3) coupled to at least one first memory cell; a current source (e.g., $I_{ref}$) configured to provide a reference current; a first transistor (e.g., M1), coupling the current source to the bitline, wherein a first gate voltage of the first transistor is increased in magnitude during sensing of the first memory cell; a detector (e.g., 130) having an input coupled to the bitline, wherein the detector is configured to detect whether the first memory cell has reached a threshold (e.g., cell has snapped or exhibited a snapback behavior); and a second transistor (e.g., M2) providing a supply voltage to the detector, wherein a second gate voltage of the second transistor is increased in magnitude during the sensing of the first memory cell.

In one embodiment, the detector is an inverter.

In one embodiment, the first and second gate voltages are a same ramping voltage (e.g., Vramp).

In one embodiment, the first and second gate voltages are ramped at a same rate (e.g., different voltage magnitudes, but ramped at the same rate).

In one embodiment, the supply voltage is of a first polarity (e.g., a positive voltage from Vpp), and the apparatus further comprises a third transistor (e.g., PMOS device) providing a supply voltage of a second polarity (e.g., a low or negative voltage from Vnn or ground) to the detector.

In one embodiment, a third gate voltage of the third transistor is ramped in magnitude during the sensing at a same rate as the first and second gate voltages.

In one embodiment, the first and second transistors are n-type, and the third transistor is p-type.

In one embodiment, the memory array is a cross-point array, the bitline is a pillar (e.g., bitline pillar 1104 of FIG. 9) extending vertically above a semiconductor substrate, and the memory cells are chalcogenide memory cells.

In one embodiment, a system comprises: sensing circuitry (e.g., 122) configured to sense memory cells of a memory device; bias circuitry (e.g., 124) configured to bias an access line coupled to at least one first memory cell, and to supply power to the sensing circuitry; and a controller (e.g., 120) configured to: receive a read command from a host device; in response to receiving the read command, initiate a read operation; increase a magnitude of at least one ramp voltage (e.g., Vramp) during the read operation; apply, using the bias circuitry, a current (e.g., Iref) to the access line during the read operation, wherein applying the current to the access line is controlled using the ramp voltage; and sense, using the sensing circuitry, the first memory cell to determine whether the first memory cell has reached a threshold, wherein supply of power to the sensing circuitry is controlled using the ramp voltage.

In one embodiment, the sensing circuitry is configured to sense the first memory cell using a first polarity or an opposite second polarity, wherein the first or second polarity is selected by the controller.

In one embodiment, the sensing circuitry comprises an inverter, and a threshold voltage of the inverter increases as a magnitude of the ramp voltage increases.

In one embodiment, a leakage current of the first memory cell increases as the voltage on the access line increases.

In one embodiment, the bias circuitry comprises a transistor (e.g., n-type MOSFET) coupled to the access line; and the ramp voltage is applied to a gate of the transistor.

In one embodiment, the bias circuitry supplies power to the sensing circuitry using a first supply voltage of a first polarity (e.g., Vpp for positive polarity, or ground for negative polarity) and a second supply voltage of an opposite second polarity (e.g., ground for positive polarity, or Vnn for negative polarity), wherein the ramp voltage controls a magnitude of the first and second supply voltages.

In one embodiment, a detection threshold (e.g., inverter threshold) of the sensing circuitry increases at a same rate as an increase in the magnitude of the ramp voltage.

In one embodiment, the at least one ramp voltage includes a first and second ramp voltage; a magnitude of the second ramp voltage is lower than a magnitude of the first ramp voltage; the bias circuitry comprises an n-type transistor and a p-type transistor; the first supply voltage is coupled to the sensing circuitry (e.g., inverter) by the n-type transistor, and the first ramp voltage is applied to a gate of the n-type transistor during the read operation; and the second supply voltage is coupled to the sensing circuitry by the p-type transistor, and the second ramp voltage is applied to a gate of the p-type transistor during the read operation.

In one embodiment, a method comprises: applying a first voltage to a wordline (e.g., 1106) to access at least one memory cell in a three-dimensional cross-point memory array, wherein the wordline extends in a horizontal direction above a semiconductor substrate; applying a second voltage to a bitline (e.g., pillar 1104) to access the memory cell, wherein the bitline extends in a vertical direction above the semiconductor substrate; increasing a magnitude of at least one gate voltage (e.g., Vramp) during a sensing operation to read the memory cell; controlling the second voltage using the gate voltage; detecting a logic state of the memory cell, wherein a detection threshold (e.g., inverter threshold) is controlled using the gate voltage; and providing an amplified output indicating the logic state of the memory cell.

In one embodiment, a magnitude of the detection threshold increases as the magnitude of the gate voltage increases.

In one embodiment, the method further comprises limiting a current flow (e.g., limiting current using current source $I_{ref}$) through the memory cell during the sensing operation.

In one embodiment, the at least one memory cell is a self-selecting memory cell (e.g., a chalcogenide memory cell), and a magnitude of a bias voltage applied across the memory cell during the sensing operation corresponds to a threshold voltage of the memory cell.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, “coupled to” or “coupled with” generally refers to a connection between components, which can be an indirect communicative connection or direct communicative connection (e.g., without intervening components), whether wired or wireless, including connections such as electrical, optical, magnetic, etc.

Reference in this specification to “one embodiment” or “an embodiment” means that a particular feature, structure, or characteristic described in connection with the embodiment is included in at least one embodiment of the disclosure. The appearances of the phrase “in one embodiment” in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A “computer-readable medium” as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a “computing device” include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:

a memory array having memory cells;

a bitline coupled to at least one first memory cell;

a current source configured to provide a reference current; and a first transistor, coupling the current source to the bitline, wherein a first gate voltage of the first transistor is increased in magnitude during sensing of the first memory cell.

2. The apparatus of claim 1, further comprising a detector having an input coupled to the bitline, wherein the detector is configured to detect whether the first memory cell has reached a threshold, wherein the detector is an inverter.

3. The apparatus of claim 1, further comprising a second transistor providing a supply voltage to the detector, wherein a second gate voltage of the second transistor is increased in magnitude during the sensing of the first memory cell, wherein the first and second gate voltages are a same ramping voltage.

4. The apparatus of claim 3, wherein the first and second gate voltages are ramped at a same rate.

5. The apparatus of claim 1, wherein the supply voltage is of a first polarity, the apparatus further comprising a third transistor providing a supply voltage of a second polarity to the detector.

6. The apparatus of claim 3, wherein a third gate voltage of the third transistor is ramped in magnitude during the sensing at a same rate as the first and second gate voltages.

7. The apparatus of claim 5, wherein the first and second transistors are n-type, and the third transistor is p-type.

8. The apparatus of claim 1, wherein the memory array is a cross-point array, the bitline is a pillar extending vertically above a semiconductor substrate, and the memory cells are chalcogenide memory cells.

9. A system comprising:

sensing circuitry configured to sense memory cells of a memory device;

an access line coupled to at least one first memory cell, and to supply power to the sensing circuitry; and a controller configured to:

receive a read command from a host device;

in response to receiving the read command, initiate a read operation; and increase a magnitude of at least one ramp voltage during the read operation.

10. The system of claim 9, wherein the controller is further configured to sense, using the sensing circuitry, the first memory cell to determine whether the first memory cell has reached a threshold, wherein the sensing circuitry is configured to sense the first memory cell using a first polarity or an opposite second polarity, wherein the first or second polarity is selected by the controller.

11. The system of claim 9, wherein the sensing circuitry comprises an inverter, and a threshold voltage of the inverter increases as a magnitude of the ramp voltage increases.

12. The system of claim 9, wherein a leakage current of the first memory cell increases as the voltage on the access line increases.

13. The system of claim 9, further comprising bias circuitry configured to bias an access line coupled to at least one first memory cell, and to supply power to the sensing circuitry, wherein the bias circuitry comprises a transistor coupled to the access line; and the ramp voltage is applied to a gate of the transistor.

14. The system of claim 13, wherein the bias circuitry supplies power to the sensing circuitry using a first supply voltage of a first polarity and a second supply voltage of an opposite second polarity, wherein the ramp voltage controls a magnitude of the first and second supply voltages.

15. The system of claim 14, wherein a detection threshold of the sensing circuitry increases at a same rate as an increase in the magnitude of the ramp voltage.

16. The system of claim 14, wherein:

the at least one ramp voltage includes a first and second ramp voltage;

a magnitude of the second ramp voltage is lower than a magnitude of the first ramp voltage;

the bias circuitry comprises an n-type transistor and a p-type transistor;

the first supply voltage is coupled to the sensing circuitry by the n-type transistor, and the first ramp voltage is applied to a gate of the n-type transistor during the read operation; and the second supply voltage is coupled to the sensing circuitry by the p-type transistor, and the second ramp voltage is applied to a gate of the p-type transistor during the read operation.

17. A method comprising:

applying a first voltage to a wordline to access at least one memory cell in a three-dimensional cross-point memory array;

applying a second voltage to a bitline to access the memory cell;

increasing a magnitude of at least one gate voltage during a sensing operation to read the memory cell;

controlling the second voltage using the gate voltage;

detecting a logic state of the memory cell; and providing an amplified output indicating the logic state of the memory cell.

18. The method of claim 17, wherein a magnitude of a detection threshold increases as the magnitude of the gate voltage increases.

19. The method of claim 17, further comprising limiting a current flow through the memory cell during the sensing operation.

20. The method of claim 17, wherein the at least one memory cell is a self-selecting memory cell, and a magnitude of a bias voltage applied across the memory cell during the sensing operation corresponds to a threshold voltage of the memory cell.

* * * * *